United States Patent
Côté et al.

(10) Patent No.: US 6,671,839 B1
(45) Date of Patent: Dec. 30, 2003

(54) SCAN TEST METHOD FOR PROVIDING REAL TIME IDENTIFICATION OF FAILING TEST PATTERNS AND TEST BIST CONTROLLER FOR USE THEREWITH

(75) Inventors: Jean-François Côté, Chelsea (CA); Benoit Nadeau-Dostie, Aylmer (CA)

(73) Assignee: LogicVision, Inc., San Jose, CA (US)

( * ) Notice: Subject to any disclaimer, the term of this patent is extended or adjusted under 35 U.S.C. 154(b) by 0 days.

(21) Appl. No.: 10/180,116

(22) Filed: Jun. 27, 2002

(51) Int. Cl.⁷ .............................................. G01R 31/28
(52) U.S. Cl. ........................ 714/726; 324/16; 324/46
(58) Field of Search ................. 714/726–739; 324/765, 46, 16

(56) References Cited

U.S. PATENT DOCUMENTS

| | | | |
|---|---|---|---|
| 4,652,814 A | * | 3/1987 | Groves et al. .............. 714/738 |
| 4,801,870 A | | 1/1989 | Eichelberger et al. |
| 5,732,209 A | | 3/1998 | Vigil et al. |
| 5,831,992 A | * | 11/1998 | Wu ............................ 714/732 |
| 5,930,270 A | | 7/1999 | Forlenza et al. |

* cited by examiner

Primary Examiner—Albert Decady
Assistant Examiner—Guy Lamarre
(74) Attorney, Agent, or Firm—Eugene E. Proulx

(57) ABSTRACT

A method of scan testing an integrated circuit to provide real time identification of a block of test patterns having at least one failing test pattern comprises performing a number of test operations and storing a test response signature corresponding to each block of test patterns into a signature register; replacing the test response signature in the signature register with a test block expected signature; identifying the block as a failing test block when the test response signature is different from the test block expected signature; and repeating preceding steps until the test is complete.

70 Claims, 8 Drawing Sheets

SCAN TEST METHOD FOR PROVIDING REAL TIME IDENTIFICATION OF FAILING TEST PATTERNS AND TEST BIST CONTROLLER FOR USE THEREWITH

The present invention relates, in general, to the design and testing of integrated circuits and, more specifically, to a of circuit scan testing method which provides real time identification of failing test patterns or small blocks of test patterns.

BACKGROUND OF THE INVENTION

Scan testing of integrated circuits (ICs) generally involves loading test patterns or vectors into scannable memory elements of the circuit, capturing the response of the circuit to the test patterns, unloading the test response from the memory elements. Conventional scan techniques have a number of limitations in terms of the large amount of test data that need to be stored and frequencies at which the test patterns can be applied. Embedded test methods address these limitations by providing on-chip circuitry to generate patterns and analyze their output response. The output can be analyzed by compressing the test response into a signature register and then comparing the signature obtained with an expected signature. A set or block of test patterns fails when the actual signature obtained and the expected signature are different. Typically, a plurality of test patterns are executed and only the final signature is compared with a final expected signature. A major advantage of using embedded test methods is that simply comparing the final signature with an expected final signature is sufficient to determined whether any patterns resulted in failures. This provides for a very low volume of test data, but it not very efficient when a list of failing patterns is required. For example, such list is needed to determine which patterns tend to fail more often than others. Diagnosis can be performed to identify the root cause of the failures which could be due to an uncontrolled process or a design error.

It would be desirable to be able to identify failing test patterns, or small blocks of test patterns having a failing pattern, in real time. There are several problems that must be addressed in order to find all failing patterns in one pass through all patterns. First, signature values must be observed and/or compared after execution of each pattern (or trial) or small block of patterns. Second, a failure in one pattern must not influence the resulting signatures in the following patterns. Third, the transfer of information between the test controller(s), possibly running at high speed, and the tester must be synchronized without increasing test time, requiring to contact a large number of circuit pins, increasing pin accuracy requirements on the tester, lowering test quality, significantly increasing the routing and gate count requirements of a test controller, losing any flexibility in terms of how several test controllers can run concurrently, or having to generate new test data.

Forlenza et al U.S. Pat. No. 5,930,270 granted on Jul. 27, 1999 for "Logic Built In Self-Test Diagnostic Method", partially addresses the problems listed above. However, it falls short of addressing all the requirements. For example, the MISR is reset between each interval. An interval is a block of patterns or vectors. This means that the signatures generated for a given pattern are different depending on the size of the intervals. This requires generating a significant amount of new test data. Another major limitation is that the synchronization between the test controller and the external tester is addressed by using the same clock. This means that the test controller(s) cannot be operated at their respective speed. This is clearly not acceptable from the points of view of test time and/or test quality. The method also does not scale when several test controllers are running concurrently because the expected signatures (called "Good Machine Signatures" or GMS by Forlenza et al) are transferred using a parallel data interface because too many pins would need to be contacted.

There is clearly a need for a more efficient method of providing real time identification of failing test patterns.

SUMMARY OF THE INVENTION

The present invention provides a scan-based embedded test method and corresponding circuit which allows identifying failing test patterns or small blocks of patterns without increasing test time or calculating new expected signatures as compared to a GO/NO-GO test. One or more controllers can execute test patterns using high speed clocks, but the transfer of information between the test controller(s) can be performed using a low speed clock. Only a small number of circuit pins need to be contacted and low accuracy pin electronics can be used. The additional circuitry required by the method is small.

One aspect of the present invention is generally defined as a method of scan testing an integrated circuit to provide real time identification of a block of test patterns having at least one failing test pattern, comprising performing a number of test operations and storing a test response signature corresponding to each block of test patterns into a signature register; replacing the test response signature in the signature register with a test block expected signature; identifying the block as a failing test block when the test response signature is different from the test block expected signature; and repeating preceding steps until the test is complete.

Another aspect of the present invention is generally defined as a test controller for use in self-testing of an integrated circuit under control of a first clock and providing real time identification of blocks of test patterns having at least one failing test pattern, the controller having a test response signature register for storing a compressed test response of the circuit to a block of test patterns, the improvement comprising an expected signature register having a serial input and a serial output, and a control circuit for controlling loading of an expected signature into the expected signature register under control of a test clock and for replacing the contents of the test response signature register with the contents of the expected signature register.

BRIEF DESCRIPTION OF THE DRAWINGS

These and other features of the invention will become more apparent from the following description in which reference is made to the appended drawings in which.

DETAILED DESCRIPTION

In the following detailed description, numerous specific details are set forth in order to provide a thorough understanding of the present invention, However, it will be understood by those skilled in the art that the present invention may be practiced without these specific details. In other instances, well known methods, procedures, components and circuits have not been described in detail so as not to obscure aspects of the present invention.

While the present invention is described herein with reference to a built-in self-test (BIST) controller, it is to be understood that the method of the present invention applies to any scan testing method which uses a signature register and not only to BIST methods. Deterministic scan vectors (as opposed to pseudo-random patterns generated by a PRPG) can be scanned into memory elements and use a signature register when scanning out.

Figure 1:
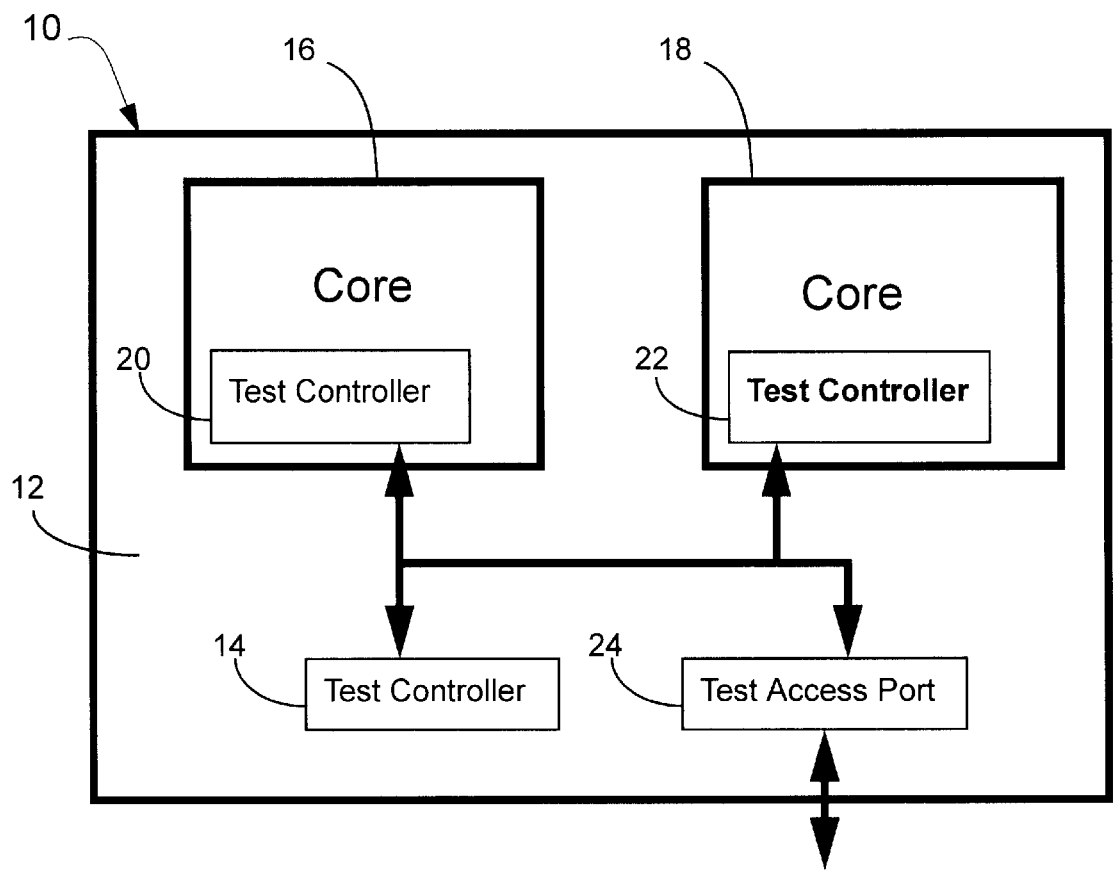
FIG. 1 is a diagrammatic view of an integrated circuit having a top level test controller and two embedded cores, each having a test controller.

FIG. 1 is a diagrammatic view of a simple integrated circuit 10, which will be used for illustration purposes. The circuit has a top level block 12 having a top level test controller 14, two embedded cores 16 and 18 having core test controllers 20 and 22, respectively. The circuit further includes a test access port (TAP) 24 for use in communicating with the test controllers.

Figure 2:
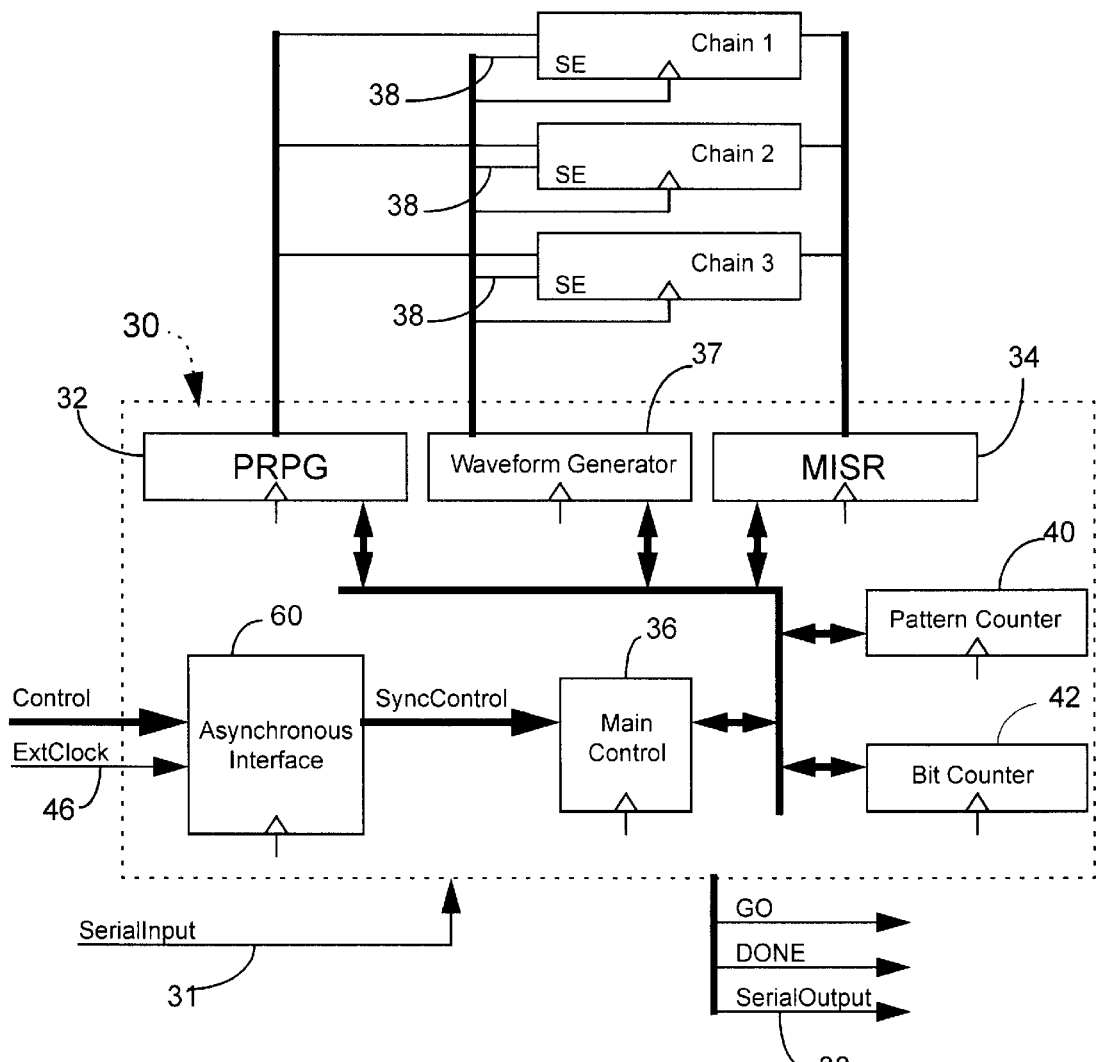
FIG. 2 is a diagrammatic view of a test controller.

FIG. 2 diagrammatically illustrates a test controller 30 having a serial input 31 and a serial output 33. In general, the test controller applies test vectors or patterns to the circuit by shifting test patterns into predefined scan chains in the circuit, compresses captured responses of the circuit into a signature register, compares the contents of the signature register to the expected contents and then issues a pass or fail result. In one embodiment, the logic test controller includes a pseudo-random pattern generator (PRPG) 32, a multiple-input signature register (MISR) 34, and logic, including a main control circuit 36, and waveform generator 37, required to perform various control functions, including providing scan-enable signals (SE) 38 and clock signals to the memory elements which form the scan chains. Three scan chains are shown in the figure. The SE signals are held high while a test pattern is being shifted into the scan chains. These signals are then taken low for at least one clock cycle, a capture cycle, when the shift operation has been completed to allow the scannable memory elements to capture circuit responses to the test patterns. The controller includes a pattern counter 40, which counts the number of patterns vectors applied and concludes a scan test at the proper time, and a bit counter 42 for counting bits. Scan tests are invoked by loading appropriate instructions into the controller via the test access port during chip, board or system tests.

Scan chains are formed by serially connecting scannable memory elements in the core blocks. As shown in FIG. 2, the scan chains in core blocks are individually linked to and between ports of PRPG 32 and MISR 34. Each scan chain operates at application or design speed, allowing for simultaneous testing of multiple frequencies and multiple clocks. The test patterns are shifted into the scan chains. The output responses are captured and compacted into a signature in a manner well known in the art. The signature can be compared to a reference signature on-chip and a pass or fail response passed to the TAP. Alternatively, the signature can be scanned out through the TAP and compared to a signature stored in an external tester.

MISR 34 is in the form of a shift register having a predetermined number of shift register elements interconnected by XOR gates (not shown) to implement a polynomial division in a manner well known in the art. The number of shift register elements varies from design to design. The number of elements should be sufficiently large to minimize the probability of aliasing, i.e., the probability of having a bad circuit producing the same signature than a good circuit. If the number of scan chains connected to the MISR is larger than the number of shift register elements of the MISR, a space compactor (not shown) can be added between the scan chains and the MISR to reduce the number of inputs applied to the signature register itself. The design of both the MISR and space compactor is well known in the art.

Figure 3:
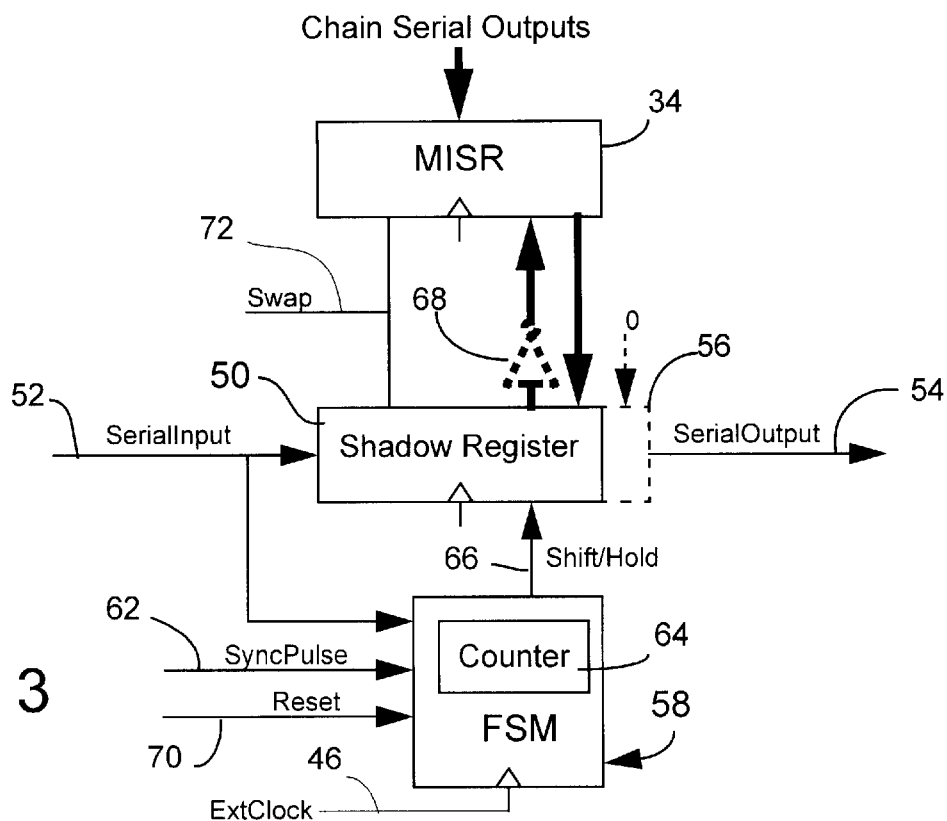
FIG. 3 is a diagrammatic view of a simple circuit which is incorporated into a test controller, according to an embodiment of the present invention, to facilitate identifying failing patterns in real time by shifting out intermediate signatures.

With reference to FIG. 3, a test controller according to the present invention is augmented by the provision of an expected signature register 50, also referred to herein as a shadow register, having a serial input 52, a serial output 54 and a plurality of memory elements which define a bit length which is at least equal to the bit length of the signature register. The memory elements of the shadow register are configurable in Hold mode for holding their contents constant and in Shift mode for shifting data through the register. The role of the shadow register is to receive and hold the expected signature of test patterns which are being executed, and, when the test patterns have completed executing, to receive the actual signature from the signature register during a swapping operation in which the expected signature is moved into the signature register and the actual signature is moved into the shadow register. The expected signature is loaded into the shadow register while the corresponding test patterns are being executed. The Hold facility is also required when the test patterns are executed at one clock rate and data is shifted through the shadow register at a different, usually slower, clock rate and for holding an expected signature until required. Optionally, an additional memory element 56 can be added to the shadow register to store a "start bit" to improve the diagnosability of the circuit.

The improved test controller further includes a control circuit 58, in the form of a Finite State Machine (FSM), for controlling loading and unloading of data into the shadow register under control of an external test clock 46, ExtClock, and for swapping the contents of the signature register and the shadow register, as explained below. FSM 58 is also provided with inputs for receiving the serial input 52 of shadow register 50, a synchronization pulse 62, called SyncPulse, and a Reset signal 70.

FSM 58 starts loading/unloading the shadow register when it receives a synchronization pulse, SyncPulse, from an asynchronous interface circuit 60 (see FIG. 2) and detects a logic 1 value, a start bit, at serial input 52. Thereafter, one bit of the expected signature is loaded/unloaded each time SyncPulse is active by the FSM applying an active Shift/Hold signal 66 to the shadow register memory elements. A counter 64 in the FSM counts the number of bits which have been loaded/unloaded into the shadow register. When the count of the counter reaches a predetermined value, the shadow register shift register memory elements are configured in Hold mode by setting Shift/Hold signal 66 inactive (logic 0).

Since the test controller, which includes the shadow register, operates at the first or system rate and data destined for the shadow register is loaded at the second or test clock rate, a mechanism must be provided to synchronize loading of the expected signature into the shadow register and unloading the signature to the tester. This is the role of asynchronous interface 60 which synchronizes shift operations of the shadow register under control of second clock, labeled ExtClock, with test controller operations performed under control of the system clock when the frequency of the first clock is different from that of the second clock. A suitable asynchronous circuit is described and claimed in U.S. Pat. No. 5,900,753 granted on May 4, 1999 for "Asynchronous Interface", incorporated herein by reference. The serial input of the shadow register is connected to serial input 31 of the test controller and the serial output of the shadow register is connected to the serial output 33 of the test controller during the loading/unloading of the shadow register.

Optionally, the expected signature can be inverted prior to being loaded into the shadow register and inverted again, using inverter 68, prior to being loaded into MISR 34, to increase the diagnosability of the circuit. That is, the inverted expected signature can be inverted when a swap is performed. Alternatively, the expected signature is not inverted and the actual signature is inverted before being shifted out. The two methods provide a way of ensuring that the expected and actual signatures were actually swapped and that the expected signature was not shifted out because of a malfunction of the test circuitry. It will be understood that there are other ways of checking the integrity of the test circuitry.

Counter 64 is inactive until an active start bit is detected, i.e., when both the synchronization pulse 62 and serial input 52 are active (logic 1). When FSM 58 detects an active start bit, it issues an active shift enable signal to the shadow register elements to configure the shadow register in Shift mode to effect shifting of the shadow register and start the counter counting down from a predetermined value with every synchronization pulse derived from the external test clock. The shadow register is configured in Hold mode between each occurrence of the synchronization pulse and after all bits of a signature have been loaded/unloaded. The FSM control circuit is responsive to a Reset signal 70 for initializing the counter and shadow register at the beginning of a test.

MISR 34 and shadow register 50 are responsive to a Swap signal 72. The Swap signal is activated after the output response of a predetermined number of patterns (or trials) has been applied to the signature register. Scan enable signal 48 is low at that time. If the predetermined number of test patterns is more than one, the output of pattern counter 40 is decoded to help generate the Swap signal. The decoding is trivial when the predetermined number is a power of two, i.e. 2, 4, 8, 16, etc., because the decoding is limited to detecting a change of a single bit of the pattern counter.

Figure 4:
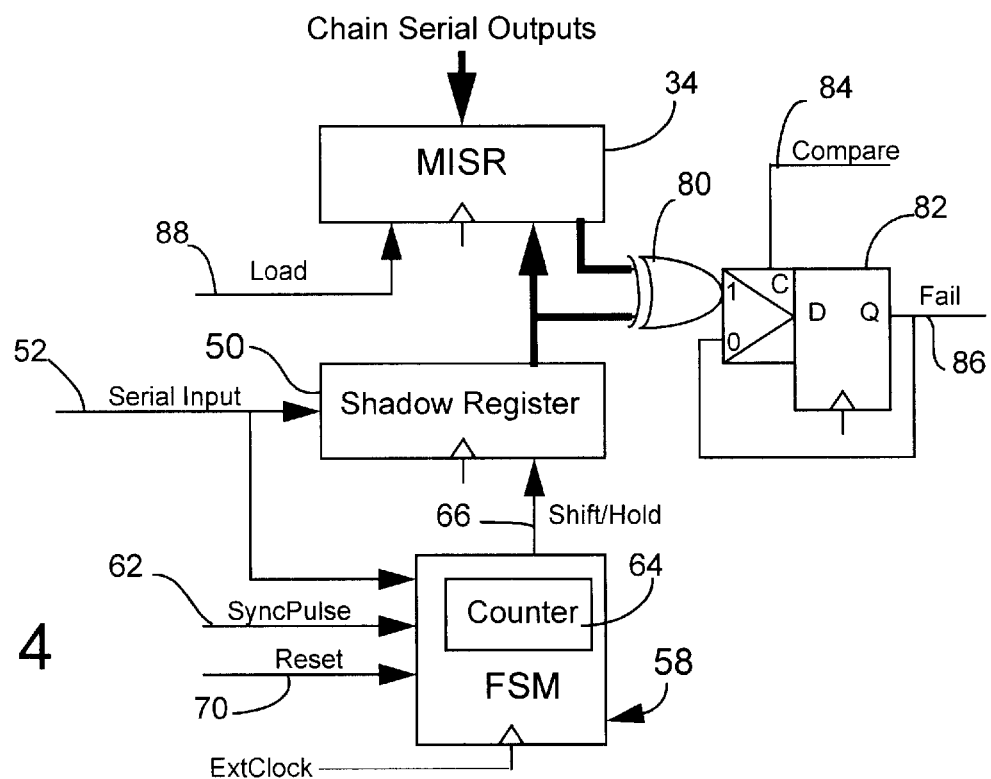
FIG. 4 is a diagrammatic view of a simple circuit which is incorporated into a test controller, according to another embodiment of the present invention, to facilitate identifying failing patterns in real time by performing on-chip comparison of signatures

FIG. 4 shows another embodiment of the invention where the signature contained in MISR 34 is compared on-chip against the expected signature contained in the shadow register using a comparator 80. This embodiment provides the advantage that only a single bit of information is required to indicate whether a block of patterns has failed. In contrast, the embodiment of FIG. 3 requires storing several bits of information for each block failure. However, these extra bits of information could indicate whether the failure is repetitive from one circuit to another, and, therefore, both embodiments are useful in different circumstances. The result of the on-chip comparison is stored in memory element 82 when compare signal 84 is active. Memory element 82 generates a Fail output signal 86 that can be observed at a circuit output, such as at serial output 33 of the test controller. Compare signal 84 can be generated the same way as the Swap signal of FIG. 3. The expected signature is loaded into the MISR under the control of the Load signal 88. Again, the Load signal can be generated the same way as the Swap signal of FIG. 3.

Figure 5:
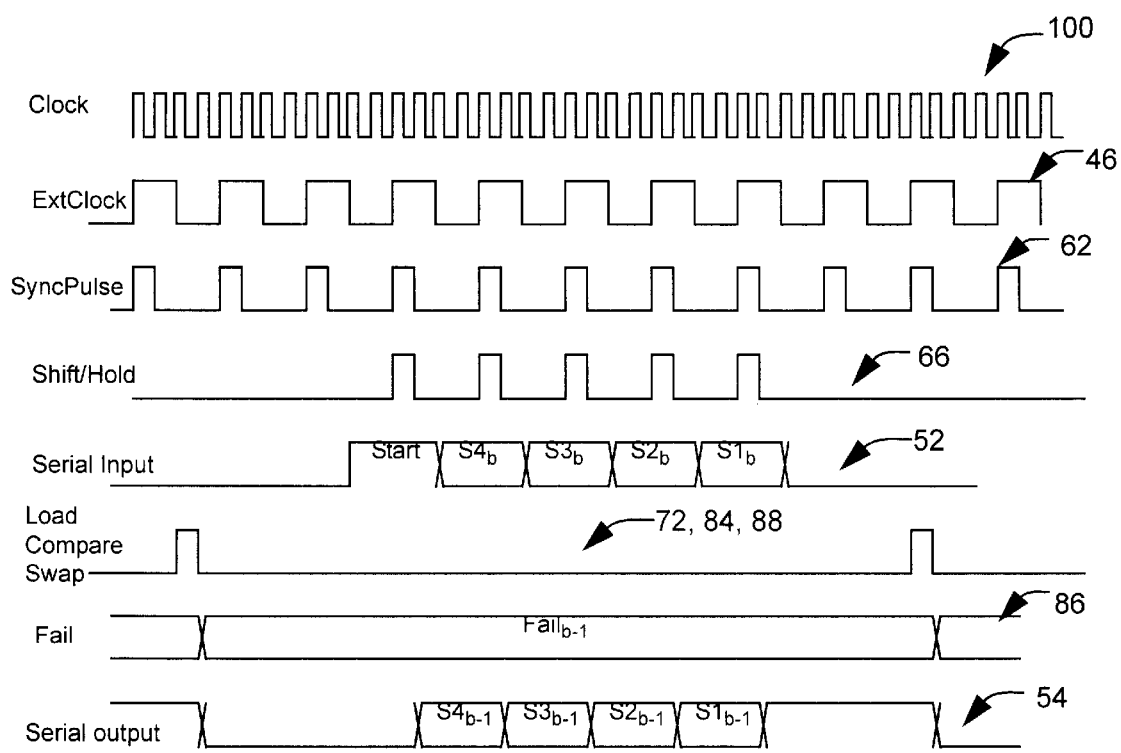
FIG. 5 is a timing diagram showing the behavior of key signals of embodiments of FIGS. 3 and 4.

FIG. 5 is a timing diagram which shows the behavior of key signals for embodiments of FIGS. 3 and 4. Waveform 100 is the test controller clock signal. This clock is derived from the system clock. Waveform 46 is the external test clock, ExtClock, which is typically a slower clock than the test controller clock. In this example, it is shown to be approximately four times slower. Waveform 62 is the synchronization signal, SyncPulse, and shows the synchronization pulses generated in response to the falling edges of the external test clock. The duration of the synchronization pulses is identical to the period of the test controller clock. Waveform 66 shows the behavior of the Shift/Hold signal. The Shift/Hold signal is derived from the synchronization pulse. The first pulse of Shift/Hold coincides with the occurrence of the start bit on the serial input. Waveform 52 shows the serial input data stream which contains the expected signature and which, in this case, includes the optional start bit which is stored in memory element 56 (see FIG. 3). The number of pulses on Shift/Hold corresponds to the number of bits in the shadow register. Once counter 64 has counted the correct number of bits, it forces Shift/Hold inactive, which configures the shadow register in hold mode. The serial input is set inactive (logic 0) after all bits of the expected signature corresponding to a test block has been shifted in as shown by waveform 108. Some time after a replacement of the signature of the MISR with the expected signature, the serial input is set active (logic 1) to mark the beginning of the next expected signature with a start bit. Waveform 72, 84, 88 show the behavior of the Swap signal used in the embodiment of FIG. 3 and of the Load and Compare signals in the embodiment of FIG. 4. As indicated earlier, these signals can be identical to one another and this is the case in FIG. 5.

In the embodiment of FIG. 3, the contents of the MISR can be swapped or exchanged with the contents of the shadow register in a single clock cycle. However, In the embodiment of FIG. 4, it is possible that comparator 80 includes pipelining stages and that the result of the comparison is not available within a single clock cycle of the test controller clock. In this case, the compare signal needs to be delayed with respect to the Load signal. The delay is the number of clock cycles corresponding to the number of pipelining stages in the comparator. Typically, this delay is only one or two clock periods of the test controller clock. Waveform 86 shows the behavior of the Fail signal which is shifted accordingly to the right. It is still very easy for an external tester to sample the Fail signal.

Waveform 54 shows the behavior of the shadow register serial output of the embodiment of FIG. 3. The serial output goes inactive (logic 0) in response to the Swap signal due to the loading of an inactive value in memory element 56 which holds the start bit. The serial output remains inactive until the start bit is detected at the serial input. From that point on, the signature of the MISR corresponding to the previous block of patterns, and that is now stored in the shadow register, is shifted out through the serial output concurrently with the shifting in through the serial input of the expected signature for the next block of patterns.

As mentioned previously, the test controller need not be a built-in self-test controller having a PRPG. Test patterns can be loaded into scan chains in a variety of ways well known in the art, including direct connections of the scan chains to chip pins, pattern generators that autonomously generate test patterns (pseudo-random or any other types), or pattern generators that require assistance from an external tester for compressed information (e.g. seeds or other information).

Figure 6:
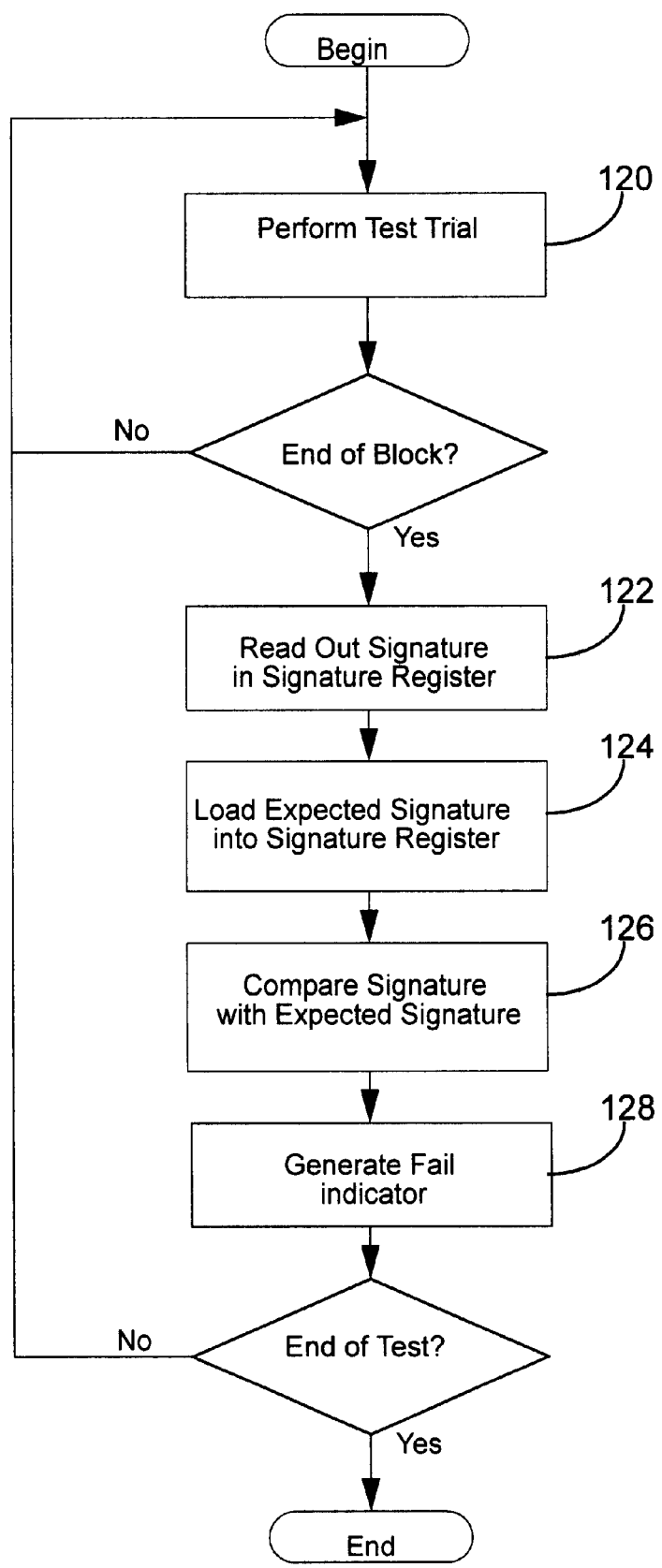
FIG. 6 is a flow chart illustrating various steps of a method according to an embodiment of the present invention.

The present invention provides a method of scan testing an integrated circuit to provide real time identification of a group or block of test patterns having at least one failing test pattern. Referring to FIG. 6, the method generally comprises performing a number of test operations and storing a corresponding test response signature into the signature register (step 120); reading out the signature from the signature register (step 122) and loading an expected signature into the signature register (step 124); comparing the signature of the signature register with an expected signature (step 126) and identifying a block as a failing test block when the signature is different from the expected signature (step 128) and repeating preceding steps until the test is complete. A test operation comprises loading a test pattern into scannable memory elements of the circuit, capturing the response of the circuit to the test pattern, unloading the test response from the memory elements, and compressing the test response into the signature register.

In a first embodiment, the steps of reading out the signature and loading an expected signature comprises swapping the contents of the signature register with the contents of the shadow register containing an expected signature. The swap occurs when execution of a block of test patterns has been completed. Optionally, as mentioned earlier, one of the signatures is inverted to avoid masking of errors in the test controller itself. The expected signature can be inverted when the swap is performed. Alternatively, the actual signature is inverted before being shifted out. The loading of the expected signature for the block of patterns currently being applied to the circuit occurs concurrently with unloading of the actual signature of the previous block of patterns. Another option to avoid masking of errors in the test controller is the addition of a memory element to the shadow register to store the start bit. This bit is inverted during the swap of signatures to prove that the swap took place.

In a second embodiment of the method, the steps of reading out the signature and loading an expected signature comprises applying the contents of the signature register to the input of an on-chip comparator and loading the contents of the shadow register into the signature register.

Typically, the test blocks are performed under control of a first clock, usually operating at the application or design speed (also called system speed) of the core block, while the loading and unloading of the shadow register contents is performed under control of a second clock, usually a slower test clock. The goal of the method is to maximize the number of times the signature register can be updated without interrupting the application of test patterns to the circuit. Ideally, the signature can be updated after each trial. A trial refers to the loading of a test pattern, capturing the circuit response and unloading the responses into the MISR. In order to achieve this goal, there must be enough clock cycles of the second clock to scan in all the bits of an expected signature. Because a start bit is needed for synchronization (i.e. to start counter 64 and other functions in FSM 58), the MISR width plus one is the number of second clock cycles that must fit within a single trial. If a clock ratio (i.e., the clock rate of the first clock divided by the second clock) of four is assumed, and a maximum scan chain length of 512 is tested by the logic BIST controller, the trial duration is 128 (512/4) clock cycles when expressed in terms of the second clock. This number of clock cycles is sufficient to accommodate an average sized MISR of 24 or 32 bits. For higher system clock frequencies, the clock ratio might need to be increased to 8 or 16. For a clock ratio of 16, there are enough second clock cycles for a 24-bit MISR, but not for a 32 bit MISR.

Accordingly, the logic test controller is, preferably, run-time programmable to load the MISR and compare signatures every 1, 2, 4 or 8 trials. As indicated earlier, it is preferable to choose a block size which is a power of two, such as 1, 2, 4, 8 . . . , to facilitate the decoding of the output of the pattern counter. The larger the block size, the more time it will take to find the actual failing trial and, ultimately, the memory elements that captured an erroneous circuit response. It is reasonable to expect that a tester can provide a 50 MHz clock as the second test clock. This means that, with a clock ratio of 8, the system clock may be as high as 400 Mhz before a test block size greater than 1 is required.

When the number trials per block is 1, the method identifies all failing patterns in real time. When the number is greater than 1, the method would identify groups or blocks of test patterns in which at least one of the patterns is a failing pattern.

When the system clock and test clocks are asynchronous, the method further includes synchronizing the test pattern loading and unloading with the loading and unloading of the shadow register. Synchronization comprises configuring the shadow register in a hold mode; detecting a start bit indicating that a new expected signature is to be scanned in; shifting in the expected signature by configuring the shadow register in a combination of shift mode and hold mode, which includes shifting in one bit each time a predetermined transition of the second test clock is detected. The transitions are detected by a transition detector in the asynchronous interface which generates a synchronization pulse.

Figure 7:
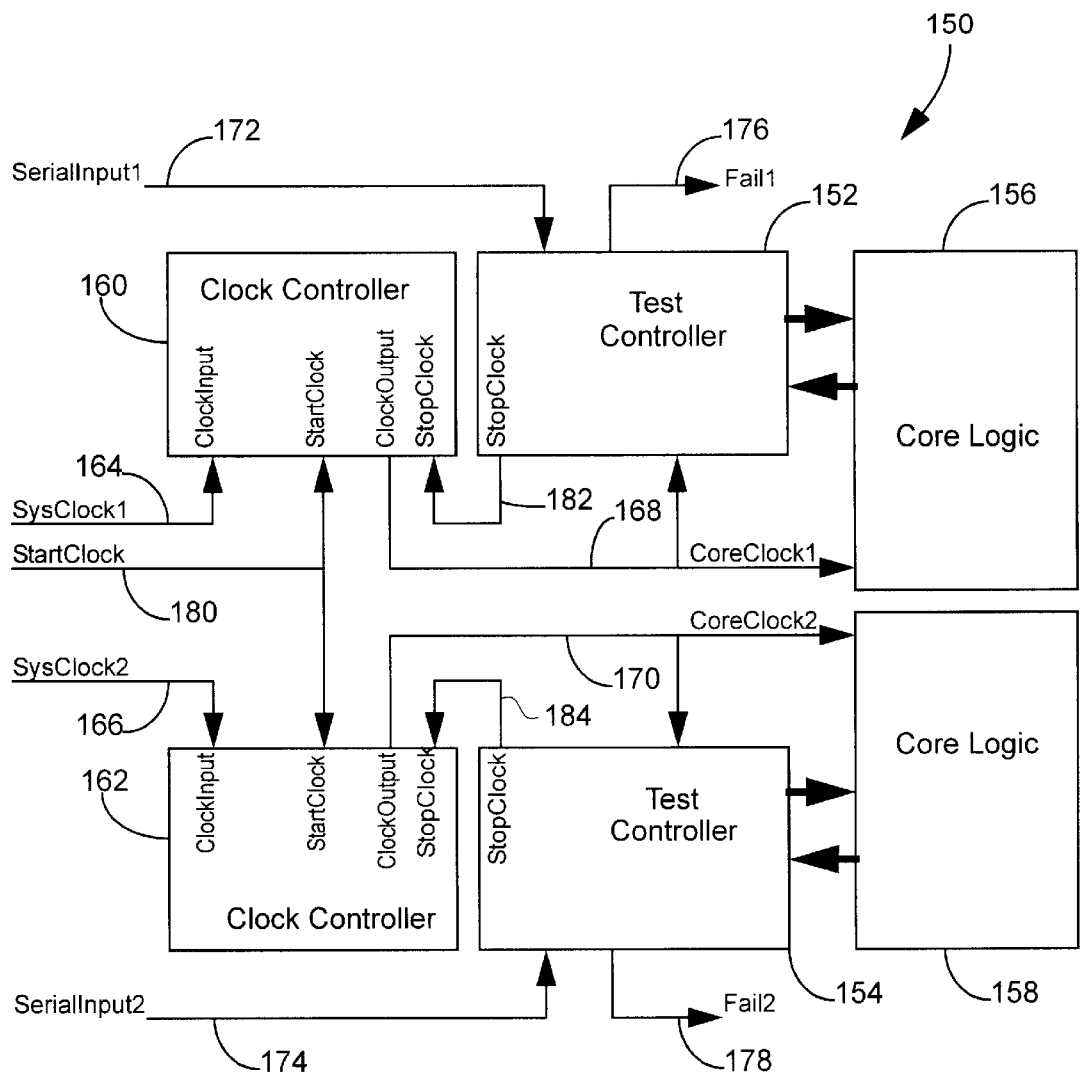
FIG. 7 is a diagrammatic view of a circuit containing two test controllers controlled by asynchronous clocks and modified to facilitate identifying failing patterns in real time.

Two or more cores can be tested simultaneously in parallel at application or design speed or at a slower test clock speed. Tests performed at speed tend to require a more complex tester program to synchronize the loading of expected signatures into the respective shadow register of the cores, particularly when an integrated circuit contains several cores with multiple scan chains of varying lengths and different application frequencies. FIG. 7 shows a circuit 150 having two test controllers 152 and 154, for testing associated core logic 156 and 158, respectively. Circuit 150 could be a subset of the circuit of FIG. 1.

In one embodiment, clock controllers 160 and 162 are optionally provided for synchronizing the loading of expected signatures. However, the clock controllers can be used for various other purposes requiring clock control (e.g. input clock division, modulation or suppression for reduction of power consumption or diagnosis). Lets assume for now that the clock controllers are configured such that the system clocks, SysClock1 164 and SysClock2 166 are connected to their respective core clocks CoreClock1 168 and CoreClock2 170, respectively, without modification. We are interested in the behavior of the serial inputs to the test controllers (signals SerialInput1 172 and SerialInput2 174) as well as the fail indicators, signals Fail1 176 and Fail2 178). As indicated earlier, the serial output of the shadow register can be the signal observed to transfer the actual signature corresponding to a block of patterns.

Figure 8:
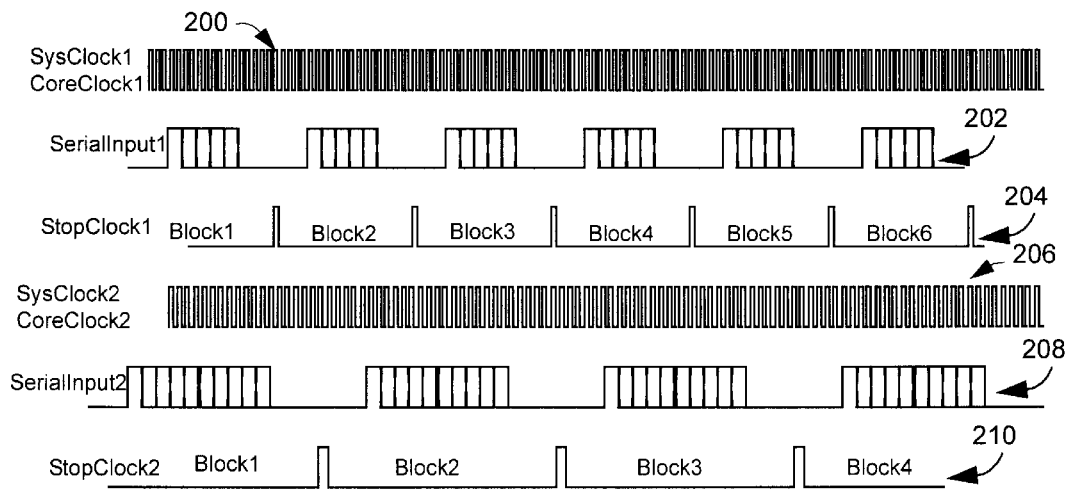
FIG. 8 is a timing diagram showing the behavior of key signals of embodiment of FIG. 7 where the two controllers are not synchronized

FIG. 8 illustrates the timing of key signals of the two test controllers tested at speed, in parallel and having different clock frequencies and/or chain sizes. Waveforms 200, 202 and 204 are the clock, serial input and compare signals, respectively, associated with test controller 152. Waveforms 206, 208 and 210 are the clock, serial input and compare signal, respectively associated with test controller 154. The system and core clocks are free-running as shown by waveforms 200 and 206. Waveforms 202 and 208, (SerialInput1 and SerialInput2) show that six expected signatures are loaded into the first controller while only four expected signatures are loaded into the second controller in about the same time. Each expected signature begins with a start bit followed by the expected signature for a corresponding block of patterns. Based on the clock frequency, maximum chain length and number of patterns in a block, it is easy to calculate the time available to load a signature using the external clock. It is also easy to predict when to start loading the signatures based on the time the controllers were started. There is one external clock cycle of uncertainty due to the synchronization through the asynchronous interface and this is why the start bit does not occur immediately following the compare signal. A similar margin is applied at the end of the loading to ensure that the shadow register is stable at the time the expected signature is needed to compare or load into the MISR. Waveforms 204 and 210 show the timing of the compare (as well as the load and swap) operation. The labels superimposed to the waveforms ("blockn") refer to test pattern numbers. A block may be consist of one or more test patterns. As explained in the description of FIGS. 3 and 5, the actual signature calculated by the MISR for a block of patterns can be shifted out at the same time as the expected signature for the next block of patterns is shifted in.

The waveforms illustrated in FIG. 8 are repetitive when considering each controller individually but not when considering both controllers at the same time because the product of the maximum scan chain length of the controllers and the scan clock period are the same or multiples of each other. The sequence of expected signatures for the controllers can be stored as a single long sequence. However, it might be more advantageous to have repetitive waveforms. This is the case when the product of the maximum scan chain length of the controllers and the scan clock period are the same or multiples of each other. Attempting to match the above product could result in a test controller running at a different frequency than its normal operating frequency, which is not desirable.

An alternative to the above is to load test patterns using a slow shift clock and capturing test pattern responses using an application speed clock, which is common in the art. A simpler tester program can be obtained by synchronizing the test controllers so that they all load test pattern data at the same test clock rate. The capture cycle(s) can be performed at a different, faster frequency.

If the shift and capture operations are performed at the same at-speed frequency, it is possible to synchronize the controllers to obtain a regular "expected signature scan cycle", and thereby obtain a repetitive waveform while preserving at-speed test capability. In this case, the expected signature scan cycle is the largest product of maximum scan chain length of a core and scan clock period of the clock used to load the test patterns. Further, in this case, synchronization refers to the start of test pattern loading. A method of synchronizing the beginning of the shift operation is described in U.S. Pat. No. 6,327,684 issued on Dec. 4, 2001 for "Method of Testing At-speed Circuits Asynchronous Clocks and Controller for Use Therewith", assigned to the assignee of the present invention and incorporated herein by reference.

In this embodiment, the clock controllers of FIG. 7 are required to enable and suppress the core clocks signals CoreClock1 168 and CoreClock2 170 based on two input signals, StartClock and StopClock. StartClock signal 180 is common to all clock controllers and is used to enable the core clocks. This signal is synchronized with the external clock. StopClock1 signal 182 is used to suppress core clock signal 168 and StopClock2 signal 184 is used to suppress the core clock signal 170. The StopClock signals are generated by the individual test controllers. The compare signal can be used to generate the StopClock signals.

Comparing the clock controllers of the present invention to those of U.S. Pat. No. 6,327,684, supra, it will be seen that the StopClock signal is equivalent to the end_sequence signal, the StartClock signal is equivalent to the clockoff_in signal, the ClockInput signal is equivalent to the sysclk signal, the ClockOutput signal is equivalent to the coreclk signal.

Figure 9:
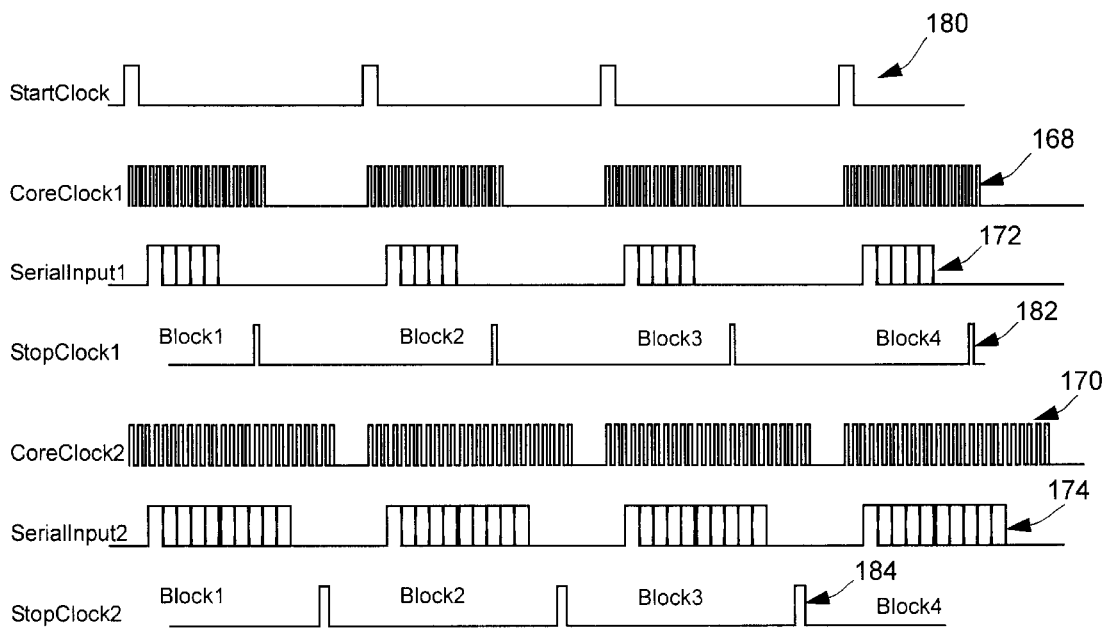
FIG. 9 is a timing diagram showing the behavior of key signals of embodiment of FIG. 7 where the two controllers are synchronized to enable short scan cycles.
Figure 10:
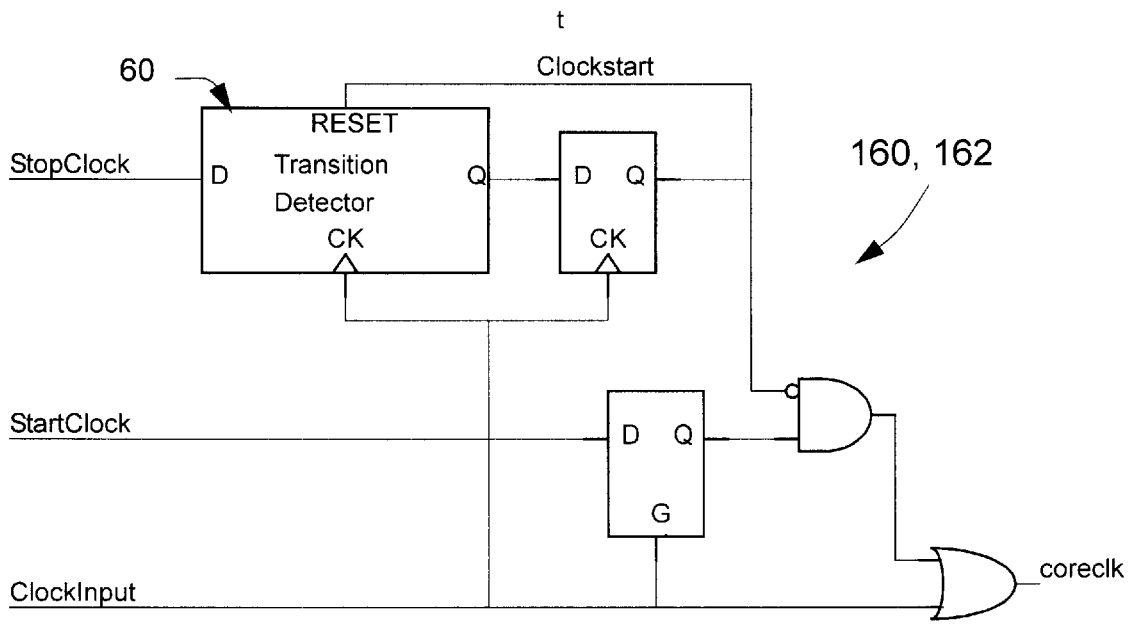
FIG. 10 illustrates a simplified version of the clock controller shown in FIG. 3 of Applicant's U.S. Pat. No. 6,327,684.
Figure 11:
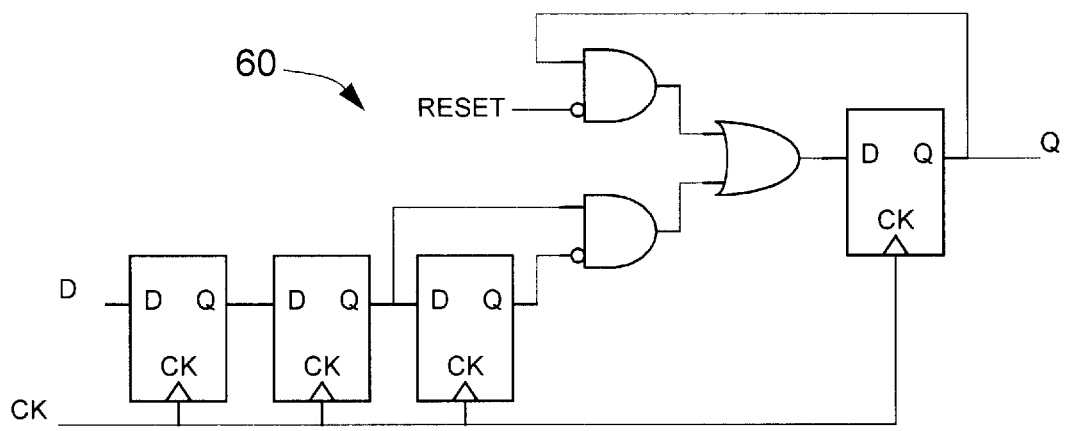
FIG. 11 illustrates a transition detector which is suitable for use in the clock controllers of the present invention.

FIG. 10 shows a simplified version of the clock controller shown in FIG. 3 of U.S. Pat. No. 6,327,684. The optional delay blocks have been removed for simplification. Clockoff_out output and associated AND gate 64 of the patent are also not necessary and have been removed. FIG. 11 shows an example of a transition detector suitable for the clock controllers described herein. The transition detector is identical to that of the '684 patent. FIG. 9 shows waveforms for the same signals described in FIG. 8 for the embodiment of the clock controller shown in FIGS. 10 and 11. The StartClock signal is added as the first waveform. The pulses of StartClock determine the duration of the "expected signature scan cycle" that allows aligning the loading of all controllers for equivalent blocks. Note that blocks do not need to have the same number of patterns for different controllers.

The waveforms for signals CoreClock1 and CoreClock2 show that the clocks are enabled shortly after the StartClock pulse and suppressed shortly after the occurrence of the compare pulse of their respective controller. The waveforms for signals SerialInput1 and SerialInput2 show that the start bits of the expected signatures can be aligned. Note that no padding of the expected signatures is required to take into account their different length in the case where counter 64 (see FIGS. 3 and 4) is implemented. This is because the counter causes the shadow register to be configured in hold mode once the exact number of signature bits have been entered. Other controllers can continue to shift in longer expected signatures. Another equivalent method of loading the expected signatures would be to align the last bits of the expected signature on the serial inputs. In this case, the start bits are not aligned. In general, for each block of test patterns of a given core, the shifting in of an expected signature begins a predetermined number of clock cycles of the test clock following a pulse of the start signal. This predetermined number may zero or greater.

Thus, it will be seen that when testing two or more cores simultaneously, the method comprises generating a start signal common to all cores under test and, for each core under test, and, for each of one or more core blocks of test operations to be performed in sequential order in the core, enabling a core clock in response to the start signal; performing an uncompleted one of the one or more blocks of test operations; loading a test block expected signature corresponding to the one of the one or more blocks of test operations into a core expected signature register under control of test clock common to all cores under test; and, upon completion of the one block of test operations in the core, generating a core clock stop signal to disable the core clock.

In addition to identifying failing blocks of patterns, the method contemplates for the masking of blocks of patterns that fail a scan test on all chips for some reason, such as a design error (e.g. incomplete decoding of tri-state bus or multiplexer, leading to contention, incomplete isolation of circuit inputs, insufficient timing margin on some paths, etc.) or any other problem which causes a systematic failure of the scan test without compromising the normal mode of operation of the circuit. The failures contemplated yield unpredictable signatures. In this case, a failure of selected blocks of patterns would be ignored and the chip would still be considered good if only these selected blocks of patterns fail. In effect, certain patterns are discarded, which reduces the fault coverage of the scan test. When a block of test patterns is discarded in this manner, an extra step can be added to re-evaluate the fault coverage of the scan test, if necessary.

Although the present invention has been described in detail with regard to preferred embodiments and drawings of the invention, it will be apparent to those skilled in the art that various adaptions, modifications and alterations may be accomplished without departing from the spirit and scope of the present invention. Accordingly, it is to be understood that the accompanying drawings as set forth hereinabove are not intended to limit the breadth of the present invention, which should be inferred only from the following claims and their appropriately construed legal equivalents.

We claim:

1. A method of scan testing an integrated circuit to provide real time identification of a block of test patterns having at least one failing test pattern, comprising:

performing a number of test operations and storing a test response signature corresponding to a block of test patterns into a signature register;

replacing the test response signature in said signature register with a test block expected signature;

identifying said block as a failing test block when said test response signature is different from said test block expected signature; and repeating the preceding steps until the test is complete.

2. A method as defined in claim 1, each said test operation comprises loading a test pattern into scannable memory element scan chains in said circuit, capturing the response of the circuit to the test pattern, unloading the test response from the memory elements, and compressing the test response into said signature register.

3. A method as defined in claim 2, further including, while performing said test operations, loading a test block expected signature into an expected signature register.

4. A method as defined in claim 3, for a circuit having two or more cores having scannable memory elements arranged in scan chains, said method further including:

performing said test operations at respective core clock rates;

performing said loading a test block expected signature into an expected signature register at a common test clock rate for all cores, and, in each core, performing said test operations in parallel with said loading a test block expected signature.

5. A method as defined in claim 3, said method further including, for a circuit having two or more cores:

generating start signal common to all cores under test and, for each core under test:

for each of one or more core blocks of test operations to be performed in sequential order in said core:

in response to said start signal:

enabling a core clock;

performing an uncompleted one of said one or more blocks of test operations;

loading a test block expected signature corresponding to said one of said one or more blocks of test operations into a core expected signature register under control of test clock common to all cores under test; and upon completion of said one block of test operations in said core, generating a core clock stop signal to disable said core clock.

6. A method as defined in claim 5, said start signal being a pulse of a signal having a sequence of uniformly spaced pulses defining an expected signature scan cycle and the start of said one more test operations.

7. A method as defined in claim 6, for each test block associated with a core, said loading of a test block expected signature commencing a predetermined number of clock cycles of said test clock following a pulse of said start signal.

8. A method as defined in claim 7, said loading a test block expected signature comprises loading said expected signature within an expected signature scan cycle common to all cores and defining the spacing of said pulses.

9. A method as defined in claim 8, said expected signature scan cycle being equal to the largest product of maximum core scan chain length and clock period of the core clock used to load said test patterns in scan chains in said cores.

10. A method as defined in claim 4 or 5, said replacing said test response signature in said signature register comprises, in each core under test:

swapping the contents of said core signature register and of said core expected signature register so that said test block signature resides in said expected signature register and said test block expected signature resides in said test response signature register;

said loading said test block expected signature into said expected signature register further comprises concurrently unloading from said core the test response signature of a preceding test block from said expected signature register; and comparing said test block signature with said test block expected signature prior to performing said identifying said block as a failing test block.

11. A method as defined in claim 10, inverting the contents of one of said registers in said core prior to said swapping the contents.

12. A method as defined in claim 4 or 5, further including, in each core, prior to said replacing said test response signature in said test response signature register with said test block expected signature, comparing the contents of said test response signature register and said test block expected signature register, and said identifying said block as a failing test block comprises generating an active fail signal when said contents are different and an inactive fail signal when said contents are the same.

13. A method as defined in claim 5, said core stop signals being generated by a core test controller.

14. A method as defined in claim 3, said replacing said test response signature in said signature register comprises swapping the contents of said signature register and of said expected signature register so that said test block signature resides in said expected signature register and said test block expected signature resides in said test response signature register.

15. A method as defined in claim 14, further including inverting the contents of one of said registers prior to said swapping.

16. A method as defined in claim 14, said loading said test block expected signature into said expected signature register comprises concurrently unloading from said circuit the test response signature of a preceding test block from said expected signature register.

17. A method as defined in claim 16, further including comparing said test block signature with said test block expected signature prior to performing said identifying said block as a failing test block.

18. A method as defined in claim 3, further including, prior to said replacing said test response signature in said test response signature register with said test block expected signature, comparing the contents of said test response signature register and said test block expected signature register, said identifying said block as a failing test block comprises generating an active fail signal when said contents are different and an inactive fail signal when said contents are the same.

19. A method as defined in claim 18, said generating an active fail signal includes storing the results of said comparing in a memory element.

20. A method as defined in claim 3, further including performing said test operations under control of a first clock having a clock rate corresponding substantially to a clock rate of said circuit, and performing said loading of said expected signature register under control of a second clock corresponding to a test clock rate of a circuit tester.

21. A method as defined in claim 20, further including operating said signature register and said expected signature register under control of the same clock.

22. A method as defined in claim 4, 5, or 20, said loading of said expected signature register comprises:
   detecting a start bit of said expected signature at a serial input of said expected signature register, said start bit indicating that a new expected signature is to be scanned into said expected signature register; and, thereafter, for each bit of said expected signature, configuring said expected signature register in shift mode on occurrence of a predetermined transition of said second test clock, shifting in said each bit of said new expected signature into said expected signature register and configuring said expected signature register in hold mode.

23. A method as defined in claim 3, 4, 5, or 20, wherein a block of test patterns comprises any integer number of test patterns.

24. A method as defined in claim 3, 4, 5, or 20 wherein a block of test patterns comprises 1, 2, 4, or 8 test patterns.

25. A method as defined in claim 3, further including, for an integrated circuit having two or more cores and two or more cores are tested concurrently, said performing a number of test operations comprising:
   substantially concurrently initiating said performing a number of test operations in all cores under test; and
   performing said loading a test block expected signature at respective core clock rates in each core under test such that the product of the maximum scan chain length in the block and clock period of the test clock is the same for all blocks under test.

26. A method as defined in claim 3, 4, or 5, further including adding a start bit at the beginning of said expected signature to indicate the beginning of a new expected signature and starting said loading of said expected signature when said start bit is detected at a serial input of said expected signature register.

27. A method as defined in claim 1, further including, while performing said test operations, loading a test block expected signature into an expected signature register; and said replacing the signature in the signature register comprises:
   inverting one of the expected signature and the test block signature;
   swapping the contents of said signature register and said expected signature register so that the test block signature resides in the expected signature register and the expected signature resides in the signature register;
   said loading the test block expected signature into said expected signature register includes concurrently unloading the test block signature of a preceding test block from the expected signature register.

28. A method as defined in claim 27, further including performing said test operations under control of a first clock having a clock rate corresponding to the design clock rate of said circuit, and performing said loading of the expected signature register under control of a second clock corresponding to a test clock rate of a circuit tester.

29. A method as defined in claim 28, said loading of said expected signature comprising detecting an expected signature start bit, and for each bit of said expected signature, configuring said expected signature register in shift mode on occurrence of a predetermined transition of said second clock, shifting in said expected signature bit, and thereafter configuring said expected signature register in hold mode.

30. A method as defined in claim 29, further including, for an integrated circuit having two or more cores and two or more cores are tested concurrently, said performing a number of test operations comprising:
   concurrently initiating the loading of test patterns and of the unloading of test responses in cores under test; and
   performing said loading and unloading at a respective block clock rate in each block under test such that the product of the maximum scan chain length in the block and clock period of the test clock is the same for all blocks under test.

31. A method as defined in claim 1, further including, while performing said test operations, loading a test block expected signature into an expected signature register; and said replacing the signature in the signature register comprises prior to said replacing said test response signature in said test response signature register with said test block expected signature, comparing the contents of said test response signature register and said test block expected signature register, said identifying said block as a failing test block comprises generating an active fail signal when said contents are different and an inactive fail signal when said contents are the same.

32. A method as defined in claim 31, further including performing said test operations under control of a first clock having a clock rate corresponding to the design clock rate of said circuit, and performing said loading of the expected signature register under control of a second clock corresponding to a test clock rate of a circuit tester.

33. A method as defined in claim 32, said loading of said expected signature comprising detecting an expected signature start bit, and for each bit of said expected signature, configuring said expected signature register in shift mode on occurrence of a predetermined transition of said second clock, shifting in said expected signature bit, and thereafter configuring said expected signature register in hold mode.

34. A method as defined in claim 33, further including, for an integrated circuit having two or more cores and two or more cores are tested concurrently, said performing a number of test operations comprising:
concurrently initiating the loading of test patterns and of the unloading of test responses in cores under test; and
performing said loading and unloading at a respective block clock rate in each block under test such that the product of the maximum scan chain length in the block and clock period of the test clock is the same for all blocks under test.

35. A method as defined in claim 1, said identifying a block as a failing test block comprising identifying the block as a failing block when the said response signature is different from said test block expected signature and said test block is not a predetermined failing block.

36. A method as defined in claim 35, further including re-evaluating the fault coverage of the scan test when predetermined failing blocks are used in said test.

37. A method of scan testing an integrated circuit to provide real time identification of a block of test patterns having at least one failing test pattern, comprising:
for each of one or more blocks of core test patterns for each core under test;
processing each of said core test patterns including loading the test pattern into scannable memory element scan chains in said core at a respective core clock rate, capturing the response of the circuit to the core test pattern, unloading the test response from the memory elements, and compressing the test response into a core test response signature register;
concurrently with said, processing, loading a test block expected signature into a core expected signature register at a common test clock rate;
upon completion of processing of each block of test patterns, replacing the test response signature in said test response signature register with said test block expected signature; and
identifying a block of test patterns as a failing test block when said test response signature is different from said test block expected signature.

38. A method as defined in claim 37, further including:
generating an active start signal for substantially concurrently in all cores initiating said processing of said blocks of test patterns and said loading of said core test block expected signature; and
generating a respective core stop signal to disable a core clock upon completion of processing of a block of test patterns.

39. A method as defined in claim 37, further including, said replacing the test response signature in the test response signature register comprises:
inverting one of the expected signature and the test block signature;
swapping the contents of said signature register and said expected signature register so that the test block signature resides in the expected signature register and the expected signature resides in the signature register;
said loading the test block expected signature into the expected signature register includes concurrently unloading the test block signature of the preceding test block from the expected signature register.

40. A method as defined in claim 37, further including, prior to said replacing said test response signature in said test response signature register with said test block expected signature, comparing the contents of said test response signature register and said test block expected signature register, said identifying said block as a failing test block comprises generating an active fail signal when said contents are different.

41. A method as defined in claim 40, said generating an active fail signal includes storing the results of said comparing in a memory element.

42. A test controller for use in self-testing of an integrated circuit under control of a first clock and providing real time identification of blocks of test patterns having at least one failing test pattern, the controller having a test response signature register for storing a compressed test response of the circuit to a block of test patterns, the improvement comprising:
an expected signature register having a serial input and a serial output, and
a control circuit for controlling loading of an expected signature into said expected signature register under control of a test clock and for replacing the contents of the test response signature register with the contents of said expected signature register.

43. A test controller as defined in claim 42, said control circuit being operable to generate a swap control signal for causing said test response signature register and said expected signature register to swap their contents.

44. A test controller as defined in claim 43, further including inverter means for inverting one of said test response signature and said expected signature prior to swapping the contents of said test response signature register and said expected signature register.

45. A test controller as defined in claim 43, further including inverter means for inverting said signature prior to unloading said signature from the expected signature register.

46. A test controller as defined in claim 42, said expected signature register having shift register memory elements corresponding in number to at least the number of memory elements of said test response signature register, each said shift register memory elements being configurable in hold mode for holding their contents constant and in shift mode for serially shifting data through said memory elements from said serial input to said serial output.

47. A test controller as defined in claim 46, said expected signature register further includes a memory element for storing a start bit, and said control circuit being responsive to a predetermined start bit value at the serial input to said expected signature register for initiating serial loading of an expected signature into said expected signature register through said serial input and unloading of a test block signature from said expected signature register through said serial output.

48. A test controller as defined in claim 42, said expected signature register having a bit length which is at least equal to the bit length of the test response signature register.

49. A test controller as defined in claim 48, said expected signature register further includes a memory element for storing a start bit.

50. A test controller as defined in claim 42, further including a comparator for comparing a test response signature in said test response signature register against a expected signature in said expected signature register and generating a Fail output signal indicating whether said signature and said expected signature are the same or different.

51. A test controller as defined in claim 50, further including storage means for storing said fail output signal.

52. A test controller as defined in claim 42, said test controller further including a pattern counter for counting test patterns, said control circuit being responsive to a predetermined count of said pattern counter by replacing the contents of said test response signature register with the contents of said expected signature register.

53. A test controller as defined in claim 42, further including a clock controller for generating a clock signal for each associated core, said clock controller being responsive at a clock start control signal for enabling said clock signal and response to a clock stop control signal for disabling said clock signal, said test controller being operable to generate said clock stop control signal when said pattern counter reaches said predetermined count.

54. A test controller as defined in claim 42, said control circuit further including a counter for counting bits shifted into said expected signature register and for configuring said expected signature register in hold mode when the count of said counter has reached a predetermined value.

55. A test controller as defined in claim 54, wherein the number of bits counted by the counter is equal to at least the length of said test response signature register.

56. A test controller as defined in claim 55, said counter being inactive while the value of a bit at the serial input is not active; and when serial input becomes active, said counter being operable to count with every pulse of said test clock and issues an active expected signature register shift enable signal with each said clock pulse to effect serial shifting of data into and out of said expected signature register.

57. A test controller as defined in claim 56, said test controller further including an asynchronous interface circuit for synchronizing the clock of said expected signature register with a shift clock used to load said expected signature into said expected signature register.

58. A test controller as defined in claim 42, said test controller further having a serial input connected to the serial input of said expected signature register and a serial output connected to the serial output of said expected signature register.

59. A test controller for use in self-testing of an integrated circuit under control of a first clock and providing real time identification of failing test patterns, the controller having a test response signature register for storing a compressed test response of the circuit to a test patterns, comprising:

an expected signature register having a serial input, a serial output, and a bit length which is at least equal to the bit length of said test response signature register;

a pattern counter for counting test patterns which have been executed;

a control circuit for controlling loading of said expected signature register under control of a test clock and for replacing the contents of said test response signature register with the contents of said expected signature register, said control circuit having a bit counter for counting the number of bits loaded into said test expected signature register, said control circuit being responsive to a predetermined test pattern count of said pattern counter for replacing the contents of said test response signature with the contents of said expected signature register;

an asynchronous interface circuit for synchronizing shift operations of said expected signature register when shift operations are performed under control of a second clock; and a serial input connected to said expected signature register serial input for loading an expected signature into said controller.

60. A test controller as defined in claim 59, said expected signature register being configurable in hold mode for holding its contents constant and in a shift mode for shifting data therethrough.

61. A test controller as defined in claim 60, said bit counter becoming active after a start bit is detected at the serial input of said expected signature register and being operable to count with every pulse of said second clock and issue an active shift enable signal to said expected signature register to configure said expected signature register in shift mode with each clock pulse to effect shifting of the expected signature register.

62. A test controller as defined in claim 61, said control circuit being responsive to a reset signal for initializing said expected signature register.

63. A test controller as defined in claim 59, said control circuit being operable to generate a swap control signal for causing said test response signature register and said expected signature register to swap their contents.

64. A test controller as defined in claim 63, further including inverter means for inverting one of said test response signature and said expected signature prior to swapping the contents of said test response signature register and said expected signature register.

65. A test controller as defined in claim 63, further including inverter means for inverting said signature prior to unloading said signature from the expected signature register.

66. A test controller as defined in claim 59, said expected signature register having shift register memory elements corresponding in number to at least the number of memory elements of said test response signature register, each said shift register memory elements being configurable in hold mode for holding their contents constant and in shift mode for serially shifting data through said memory elements from said serial input to said serial output.

67. A test controller as defined in claim 59, said expected signature register having a bit length which is at least equal to the bit length of the test response signature register.

68. A test controller as defined in claim 59, further including a comparator for comparing a test response signature in said test response signature register against a expected signature in said expected signature register and generating a Fail output signal indicating whether said signature and said expected signature are the same or different.

69. A test controller as defined in claim 68, further including storage means for storing said Fail output signal.

70. A test controller as defined in claim 69, said control circuit being operable to generate a compare control signal for causing said causing said comparator to compare the contents of said registers and a load control signal for loading the contents of said expected signature register into said test response signature register.

* * * * *